US006572991B1

(12) United States Patent
Ruppi

(10) Patent No.: US 6,572,991 B1
(45) Date of Patent: Jun. 3, 2003

(54) DEPOSITION OF γ-AL$_2$O$_3$ BY MEANS OF CVD

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 09/498,344

(22) Filed: Feb. 4, 2000

(51) Int. Cl.$^7$ .................. B32B 9/04; B32B 15/04; C23C 16/40
(52) U.S. Cl. .............. 428/699; 428/469; 428/472; 428/697; 428/698; 428/701; 428/702; 427/585; 427/255.19; 427/255.395; 51/309; 407/119
(58) Field of Search .................. 428/469, 697, 428/698, 699, 701, 702, 472; 51/307, 309; 407/119

(56) References Cited

U.S. PATENT DOCUMENTS

| 5,137,774 | A | 8/1992 | Ruppi |
| 5,587,233 | A | 12/1996 | König et al. |
| 5,674,564 | A | 10/1997 | Ljungberg et al. |
| 5,700,569 | A | 12/1997 | Ruppi |
| 5,879,823 | A | 3/1999 | Prizzi et al. |
| 6,139,921 | A | 10/2000 | Täschner et al. |
| 6,210,726 | B1 * | 4/2001 | Schiller et al. |
| 6,254,984 | B1 * | 7/2001 | Iyori |

FOREIGN PATENT DOCUMENTS

| EP | 686707 | 12/1995 |
| WO | 9924634 | 5/1999 |

OTHER PUBLICATIONS

Hirohisa Iisuka et al., "Growth of Single Crystalline –Al$_2$O$_3$ Layers on Silicon by Metalorganic Molecular Beam Epitaxy", *Applied Physics Letters*, US, American Institute of Physics, New York, vol. 61, No. 25, Dec. 21, 1992, pp. 2978–2980.

Yom, S.S. et al., Growth of γ–Al$_2$O$_3$ Thin Films on Silicon by Low Pressure MEtal–Organic Chemical Vapour Deposition, *Thin Solid Films*, CH, Elsevier–Sequoia S.A. Lausanne, vol. 213, No. 1, May 29, 1992, pp. 72–75.

Ueki Mitsui et al., "CVD Coating of Alumina Film on WC–betat–Co Cemented Carbide by Using Hydrogen Sulphide Contained Atmosphere", *Journal of The Japan Society of Powder and Powder Metallurgy*, Jun. 1994, published by Funtai Funmatsu Yakin Kyokai, Kyoto, Japan, vol. 41, No. 6, Jun. 1994, pp. 727–731.

Patent Abstracts of Japan, vol. 1998, No. 8, Oct. 3, 1998, & JP 10 068076 A (Mitsubishis Materials Corp), Mar. 10, 1998.

Oshika et al., "Unveiling the Magic of H$_2$S on the CVD–Al$_2$O$_3$ Coating", J. Phys IV France 9 (1999), Pr 8–877–Pr–8–883. No Month.

* cited by examiner

Primary Examiner—Deborah Jones
Assistant Examiner—Jennifer McNeil
(74) Attorney, Agent, or Firm—Burns, Doane, Swecker & Mathis, LLP

(57) ABSTRACT

There is disclosed a coated body having as the outer layer a layer of γ-Al$_2$O$_3$ deposited by chemical vapor deposition, preferably at a temperature of from 700–900° C. The γ-Al$_2$O$_3$ layer is formed through the use of a gaseous mixture including H$_2$S in amounts significantly higher than those presently used and at a temperature of from 700–900° C. The method is also disclosed.

26 Claims, 1 Drawing Sheet

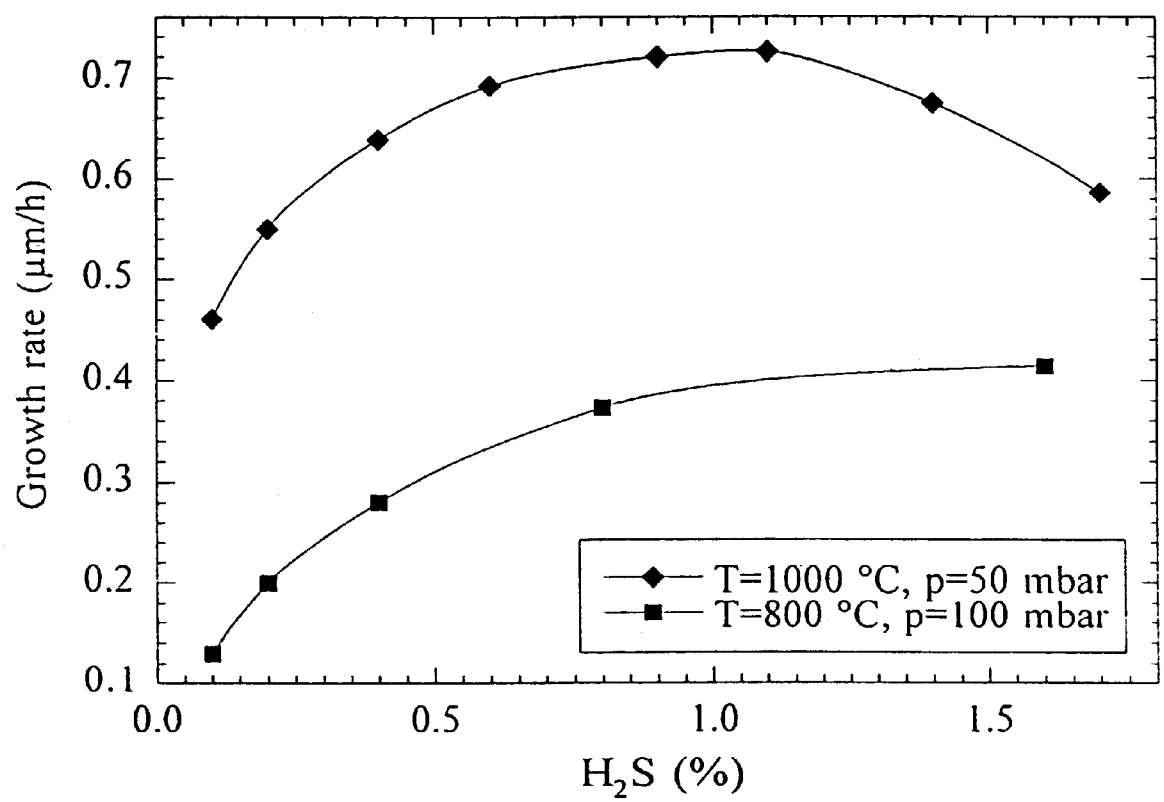

DEPOSITION OF γ-$Al_2O_3$ BY MEANS OF CVD

BACKGROUND OF THE INVENTION

Aluminum oxide (alumina, $Al_2O_3$) exists in many metastable polymorphs such as γ, η, θ, δ, κ, and χ in addition to the thermodynamically stable α-$Al_2O_3$ phase (corundum). When produced by chemical vapor deposition (CVD), $Al_2O_3$ crystallizes into κ-$Al_2O_3$ and θ-$Al_2O_3$ modifications in addition to the stable α-$Al_2O_3$. Earlier CVD coatings were usually mixtures of several polymorphs, the most commonly occurring metastable $Al_2O_3$ modification being κ-$Al_2O_3$. Today, both α-$Al_2O_3$ and κ-$Al_2O_3$ polymorphs are used as hard coatings, and they can be deposited in a controlled way by modern CVD technology shown, for example in U.S. Pat. Nos. 5,137,774 and 5,700,569.

Dopants of hydrogen sulfide ($H_2S$), phorphorus chloride ($PCl_3$) carbonoxysulfide (COS) or phosphine ($PH_3$) can be applied in order to increase the growth rate and thickness uniformity of the alumina layers. The most commonly applied dopant is $H_2S$ as also disclosed in U.S. Pat. No. 4,619,886. While amounts of $H_2S$ in the total CVD gaseous mixture of from 0.003 to 1% by volume and temperatures of 700 to 1200° C. are broadly disclosed in that patent, all exemplifications of the process therein are below 0.5 vol % and generally around 0.1 to 0.3 vol % $H_2S$ used at temperatures of 1000–1030° C. $H_2S$ has been called the "magical dopant" in view of its effect on improving the growth rate and uniformity of $Al_2O_3$ coatings applied by conventional CVD techniques at temperatures around 980° C. See, Oshika et al., "Unveiling the Magic of $H_2S$ on the CVD-$Al_2O_3$ Coating", J. Phys IV France 9 (1999), Pr 8-877–Pr 8-883.

CVD κ-$Al_2O_3$ is considered to exhibit morphological advantages (smaller grain size and lower porosity), lower thermal conductivity and even a higher hardness when compared with the CVD α-$Al_2O_3$ phase. These are important properties when metal cutting is concerned. However, at the relatively high temperatures (>1000° C.) reached during metal cutting, metastable κ-$Al_2O_3$ may transform to the stable α-$Al_2O_3$ polymorph. γ-$Al_2O_3$, when deposited using physical vapor deposition (PVD) or plasma assisted CVD has been found to exhibit high hardness and good wear properties. See, for example, WO 9924634 and U.S. Pat. No. 5,879,823. However, γ-$Al_2O_3$ has not been available using conventional CVD techniques.

OBJECTS AND SUMMARY OF THE INVENTION

It is an object of this invention to avoid or alleviate the problems of the prior art.

It is further an object of this invention to provide γ-$Al_2O_3$ using conventional CVD.

In one aspect of the invention there is provided a coated body having as the outer layer, a layer of γ-$Al_2O_3$ deposited by chemical vapor deposition.

In another aspect of the invention there is provided a method of forming a coated body having a layer of γ-$Al_2O_3$ comprising coating the body with a gaseous mixture of $AlCl_3$, $CO_2$, $H_2$ and $H_2S$ at a temperature of from about 600 to 800° C., the $H_2S$ being present in amounts of at least 0.7% of the total mixture.

BRIEF DESCRIPTION OF THE DRAWINGS

The FIGURE is a graph of growth rates of κ and γ-$Al_2O_3$ at varying temperatures and amounts of $H_2S$ in the gaseous coating mixture.

DETAILED DESCRIPTION OF THE PREFERRED EMBODIMENTS OF THE INVENTION

It has hitherto been thought that γ-$Al_2O_3$ can only be obtained by plasma assisted CVD or PVD processes. It has now surprisingly been found that γ-$Al_2O_3$ can be obtained by using conventional CVD under specific circumstances discussed below.

Growth rates of α-alumina vs. $H_2S$ content at 1000° C. and 800° C. are shown in The FIGURE. An important observation is that at 800° C., reasonably high growth rates could be obtained. The most important observation, however, is that at higher $H_2S$ contents, γ-$Al_2O_3$ was obtained. At 800° C. γ-$Al_2O_3$ could be obtained at $H_2S$ contents of 0.75–1.7% by volume of the total gaseous mixture, preferably greater than 1 vol %, and at a pressure of 100 mbar. At 1000° C., regardless of the amounts of $H_2S$, κ-$Al_2O_3$ is always formed. Thus, by carefully controlling the amount of $H_2S$ and the temperature of the application, the preferred polymorph, γ-alumina, can surprisingly be formed. When studied using TEM (transmission electron microscopy), γ-$Al_2O_3$ exhibited a very high defect density and obviously a high hardness.

The product of the present invention may be made utilizing conventional CVD techniques and apparatus, using, however, a greater amount of $H_2S$ than conventionally used in CVD processes and a higher pressure. $H_2S$ is added in amounts greater than 0.7 vol %, generally 0.75 to 1.7 vol %, preferably greater than 1 up to about 1.5 vol %, of the total gaseous mixture. The amounts of the other reactants can be adjusted accordingly but usually the alumina formers, an aluminum halide and an oxidizing gas (e.g., water vapor formed by the reaction of $CO_2$ and/or CO and $H_2$) are maintained as before and the amount of reducing agent (excess $H_2$) is reduced.

The coating process is performed at temperatures of from about 700 to 900° C., preferably 750 to 850° C., at a pressure of from about 50 to 600 mbar, preferably from about 100 to 300 mbar, for a time sufficient to form the coating, generally from about 2 to 10 hours, preferably from about 4 to 8 hours.

The resulting coating is from about 1.0 to 5 μm, preferably from about 2 to 4 μm, in thickness.

The body on which the γ-$Al_2O_3$ layer is applied can be a cemented carbide, ceramic, cermet (for metal cutting purposes) or steel (for catalysis). These bodies are well-known in the art and any such conventional material may be used.

The γ-$Al_2O_3$ layer may be applied as the outermost or as an inner layer. When used as the outermost layer, the γ-$Al_2O_3$ layer may be applied onto an $Al_2O_3$ layer, which itself can be applied onto one or more other layers such as, for example, TiC and (Ti,Al)N. The $Al_2O_3$ layer can be an alpha phase, a kappa phase or a mixture of alpha and kappa phase $Al_2O_3$. The γ-$Al_2O_3$ layer may also be applied onto a TiN, Ti(C,N) or (Ti,Al)N layer.

Similarly, when the γ-$Al_2O_3$ layer is applied as an inner layer, there may be other layers such as $Al_2O_3$, TiC, Ti(C,N), TiN or the like applied atop the γ-$Al_2O_3$ layer.

These various inner and or outer layers may be applied by CVD, MTCVD or PVD.

The invention is additionally illustrated in connection with the following Examples which are to be considered as illustrative of the present invention. It should be understood, however, that the invention is not limited to the specific details of the Examples.

EXAMPLE 1

A single layer of $\gamma$-$Al_2O_3$ was deposited using the following process data on a Ti(C,N) layer having a thickness of 3 $\mu$m:

T=800° C.
$H_2S$=1%
$AlCl_3$=2.5%
$CO_2$=5.0%
$H_2$=balance
Pressure (P)=100 mbar
Deposition time is 6 hours A coating composed of $\gamma$-$Al_2O_3$ was obtained. The same coating was also deposited atop PVD TiN, Ti(C,N) and (Ti,Al)N layers with a thickness of 3 $\mu$m. Further, CVD coatings of $\kappa$-$Al_2O_3$ and $\alpha$-$Al_2O_3$ were deposited on the PVD layers as well as CVD layers for comparative tests dealt with later on.

| Alumina Phase | Hardness |
| --- | --- |
| $\gamma$-$Al_2O_3$ | 23 GPa |
| $\alpha$-$Al_2O_3$ | 20 GPa |
| $\kappa$-$Al_2O_3$ | 21 GPa |

Orientation Relationships

The single layers of $\gamma$-$Al_2O_3$ were deposited using the following process data on a PVD TiN, Ti(C,N) and (Ti,Al)N layers having a thickness of 3 $\mu$m:

T=700° C.
$H_2S$=1.6%
$AlCl_3$=2.5%
$CO_2$=7.0%
$H_2$=balance
P=100 mbar
Deposition time is 8 hours TEM micrographs of the PVD TiN-$\gamma$-$Al_2O_3$ interface confirmed the following orientation relationship between PVD TiN and $\gamma$-$Al_2O_3$:

$(111)_{PVD-TiN}//(111)\gamma$
$[1\bar{1}0]_{PVD-TiN}//[1\bar{1}0]\gamma$

This orientation relationship is valid for $\gamma$-$Al_2O_3$-PVD TiN, Ti(C,N) or (Ti,Al)N in general and is naturally not dependent on which technique (PVD or CVD) is used to deposit $\gamma$-$Al_2O_3$. The orientation relationship describes in general epitaxy between a face-centered cubic (fcc, preferably fcc B1) coating (TiN, Ti(C,N), (Ti,Al)N) and $\gamma$-$Al_2O_3$ (cubic spinel structure).

Cutting performance in turning of Stainless Steel 1672:
Cutting Speed: 200 m/min
Feed: 0.4 mm/r
Depth of Cut: 2.0 mm
Insert Style: CNMG 120408-M3
Coolant No

| Coating (thickness 3 $\mu$m on TiCN coating) | Average life time/min |
| --- | --- |
| $\gamma$-$Al_2O_3$ | 9.8 |
| $\alpha$-$Al_2O_3$ | 6.5 |
| $\kappa$-$Al_2O_3$ | 9.6 |

Edge strength/chipping resistance of alumina polymorphs
Turning against shoulder
Cutting Speed: 200 m/min
Feed: 0.4 mm/r
Depth of Cut: 2.0 mm
Insert Style: CNMG 120408-M3
Coolant: No

| Coating (thickness 3 $\mu$m on TiCN + 3 $\mu$m $Al_2O_3$) | Edge chipping after 2 min |
| --- | --- |
| $\gamma$-$Al_2O_3$ | 10% |
| $\alpha$-$Al_2O_3$ | 15% |
| $\kappa$-$Al_2O_3$ | 10% |

Edge strength/chipping resistance in milling SS2244
The chipping resistance of PVD TiN, Ti(C,N) and (Ti,Al)N coatings with and without an alumina top layer were studied.

Cutting Speed: 220 m/min
Feed: 0.2 mm/tooth
Depth of Cut: 2.5 mm
Insert Style: SEKN1203

| Coating | Thickness | Chipping after 600 mm | Performance/mm |
| --- | --- | --- | --- |
| PVD TiN | 3 | 5% | 3660 |
| PVD Ti(C,N) | 3 | 5% | 4200 |
| PVD (Ti,Al)N | 3 | 5% | 4600 |
| PVD TiN | 6 | 10% | 4700 |
| PVD Ti(C,N) | 6 | 10% | 5100 |
| PVD (Ti,Al)N | 6 | 10% | 6800 |
| PVD Ti(C,N)-$\gamma$-$Al_2O_3$ | 3 + 3 | 10% | 7200 |
| PVD Ti(C,N)-$\alpha$-$Al_2O_3$ | 3 + 3 | 30% | 7100 |
| PVD Ti(C,N)-$\kappa$-$Al_2O_3$ | 3 + 3 | 25% | 5100 |

It is obvious that $\gamma$-$Al_2O_3$ which can be deposited at lower temperatures than the other CVD alumina phases did not anneal out the compressive stresses in the PVD layers resulting in the better edge strength.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated body useful for metal cutting having as the outer layer, a layer of $\gamma$-$Al_2O_3$ deposited by thermal chemical vapor deposition at a temperature of from about 700 to 900° C. and an atmosphere including $H_2S$ in an amount greater than 0.7 vol. %, said body composed of a cemented carbide, cermet or ceramic, wherein the $\gamma$-$Al_2O_3$ layer has a thickness of about 1.0 to 5.0 $\mu$m.

2. The coated body of claim 1 wherein the γ-Al$_2$O$_3$ layer is deposited on one or more layers taken from the group consisting of TiC, TiN, Ti(C,N), (Ti,Al)N and Al$_2$O$_3$.

3. The coated body of claim 2 wherein the γ-Al$_2$O$_3$ layer is deposited upon one or more layers of α-Al$_2$O$_3$, κ-Al$_2$O$_3$ or mixtures thereof.

4. The coated body of claim 2 wherein the γ-Al$_2$O$_3$ layer is deposited upon a (Ti,Al)N layer.

5. The coated body of claim 1 wherein the γ-Al$_2$O$_3$ layer is deposited on a layer which has been deposited by physical vapor deposition.

6. The coated body of claim 5 wherein the γ-Al$_2$O$_3$ is deposited on one or more of TiC, TiN, Ti(C,N) and (Ti,Al)N.

7. The coated body of claim 1 wherein the γ-Al$_2$O$_3$ is deposited on a layer having a face-centered cubic structure.

8. The coated body of claim 7 wherein the γ-Al$_2$O$_3$ has an orientation relationship with the layer having a face-centered cubic structure (fcc) of (111)$_{PVD-fcc}$//(111)γ

[1$\bar{1}$0]$_{PVD-fcc}$//[1$\bar{1}$0]γ.

9. The coated body of claim 8 wherein the layer having a face-centered cubic structure is taken from the group consisting of TiN, TiC, Ti(C,N), (Ti,Al)N and mixtures thereof.

10. The coated body of claim 9 wherein the layer having a face-centered cubic structure is a fcc B1 structure deposited by CVD technique.

11. The coated body of claim 9 wherein the layer having a face-centered cubic structure is a fcc B1 structure deposited by PVD technique.

12. The coated body of claim 1 wherein the body is a cemented carbide.

13. The coated body of claim 1, wherein the atmosphere includes H$_2$S in an amount from 0.75 to 1.7 vol. %.

14. The coated body of claim 13, wherein the atmosphere includes H$_2$S in an amount from 1.0 to 1.5 vol. %.

15. The coated body of claim 1, wherein the temperature is from 750° C. to 850° C.

16. The coated body of claim 1, wherein the pressure is from 50 to 600 mbar.

17. A method of forming a coated body having a layer of γ-Al$_2$O$_3$ comprising:

providing a body to be coated; and coating the body by thermal chemical vapor deposition at a temperature of from about 700 to 900° C. and an atmosphere including H$_2$S in an amount greater than 0.7 vol. % to form the layer of γ-Al$_2$O$_3$, wherein the layer of γ-Al$_2$O$_3$ is an outer layer and has a thickness of 1.0 to 5.0 μm.

18. The method of claim 17, wherein the coating is conducted at a temperature of from about 750 to 850° C.

19. The method of claim 17, wherein the coating is conducted at a pressure of from about 100 to 500 mbar.

20. The method of claim 17, wherein the body being coated is a ceramic, cermet, cemented carbide or steel.

21. The method of claim 20, wherein the body being coated contains at least one other layer of TiC, TiN, Ti(C,N), Ti(Al,N) or Al$_2$O$_3$.

22. The method of claim 21, wherein the said other layer is applied by physical vapor deposition.

23. The method of claim 17, wherein the atmosphere includes H$_2$S in an amount from 0.75 to 1.7 vol. %.

24. The method of claim 23, wherein the atmosphere includes H$_2$S in an amount from 1.0 to 1.5 vol. %.

25. A coated body useful for catalysis having as an outer layer, a layer of γ-Al$_2$O$_3$ deposited by thermal chemical vapor deposition in an atmosphere including H$_2$S in an amount greater than 0.7 vol. %, said body composed of steel.

26. A coated body useful for metal cutting, the coated body comprising:

a cemented carbide body;

one or more layers deposited on the cemented carbide body, the one or more layers selected from the group consisting of TiC, TiN, Ti(C,N), (Ti,Al)N and Al$_2$O$_3$; and a layer of γ-Al$_2$O$_3$ deposited as an outer layer by thermal chemical vapor deposition at a temperature of from about 700 to 900° C. and an atmosphere including H$_2$S in an amount greater than 0.7 vol. %, wherein the γ-Al$_2$O$_3$ layer has a thickness of about 1.0 to 5.0 μm.

* * * * *